(12) United States Patent
Hori et al.

(10) Patent No.: US 9,773,667 B2
(45) Date of Patent: Sep. 26, 2017

(54) APPARATUS AND METHOD FOR PRODUCING GROUP III NITRIDE SEMICONDUCTOR DEVICE AND METHOD FOR PRODUCING SEMICONDUCTOR WAFER

(71) Applicant: National University Corporation Nagoya University, Nagoya-shi (JP)

(72) Inventors: Masaru Hori, Nagoya (JP); Hiroki Kondo, Nagoya (JP); Kenji Ishikawa, Nagoya (JP); Osamu Oda, Nagoya (JP)

(73) Assignee: NATIONAL UNIVERSITY CORPORATION NAGOYA UNIVERSITY, Nagoya-Shi, Aichi (JP)

( * ) Notice: Subject to any disclaimer, the term of this patent is extended or adjusted under 35 U.S.C. 154(b) by 0 days.

(21) Appl. No.: 14/548,121

(22) Filed: Nov. 19, 2014

(65) Prior Publication Data

US 2015/0140788 A1    May 21, 2015

(30) Foreign Application Priority Data

Nov. 20, 2013   (JP) ................................ 2013-239590

(51) Int. Cl.
| | |
|---|---|
| H01L 21/02 | (2006.01) |
| H01L 21/30 | (2006.01) |
| C23C 16/511 | (2006.01) |
| C30B 25/14 | (2006.01) |
| C23C 16/452 | (2006.01) |
| C30B 29/40 | (2006.01) |

(52) U.S. Cl.
CPC ........ *H01L 21/0254* (2013.01); *C23C 16/452* (2013.01); *C30B 25/14* (2013.01); *C30B 29/406* (2013.01); *H01L 21/0242* (2013.01); *H01L 21/0262* (2013.01); *H01L 21/02458* (2013.01)

(58) Field of Classification Search
CPC ..... C23C 16/452; C30B 25/14; C30B 29/406; H01L 21/0254; H01L 21/3003
USPC ........................................................ 438/181
See application file for complete search history.

(56) References Cited

U.S. PATENT DOCUMENTS

| | | | | |
|---|---|---|---|---|
| 6,162,323 A | * | 12/2000 | Koshimizu | ......... H01J 37/3244 118/723 I |
| 2006/0016559 A1 | * | 1/2006 | Kobayashi | ........ H01J 37/32082 156/345.34 |
| 2006/0021701 A1 | * | 2/2006 | Tobe | ................... H01J 37/3244 156/345.31 |
| 2006/0021969 A1 | * | 2/2006 | Donohoe | ............ C23C 16/4405 216/58 |

(Continued)

FOREIGN PATENT DOCUMENTS

JP    11-036078 A    2/1999

*Primary Examiner* — Moazzam Hossain
*Assistant Examiner* — Omar Mojaddedi
(74) *Attorney, Agent, or Firm* — McGinn IP Law Group, PLLC

(57) ABSTRACT

The production apparatus includes a shower head electrode, a susceptor for supporting a growth substrate, a first gas supply pipe, and a second gas supply pipe. The first gas supply pipe has at least one first gas exhaust outlet and supplies an organometallic gas containing Group III metal as a first gas, and the second gas supply pipe supplies a gas containing nitrogen gas as the second gas. The distance between the shower head electrode and the susceptor is greater than the distance between the first gas exhaust outlet of the first gas supply pipe and the susceptor.

20 Claims, 2 Drawing Sheets

(56) References Cited

U.S. PATENT DOCUMENTS

| | | | |
|---|---|---|---|
| 2010/0239782 A1* | 9/2010 | Sasaki | C23C 16/45565 427/575 |
| 2014/0014745 A1* | 1/2014 | Burrows | C23C 16/45565 239/548 |
| 2015/0129112 A1* | 5/2015 | Saito | H01J 37/3244 156/89.12 |
| 2015/0162193 A1* | 6/2015 | Katayama | C23C 16/24 438/488 |
| 2017/0029942 A1* | 2/2017 | Matsumoto | B01J 23/75 |

* cited by examiner

APPARATUS AND METHOD FOR PRODUCING GROUP III NITRIDE SEMICONDUCTOR DEVICE AND METHOD FOR PRODUCING SEMICONDUCTOR WAFER

BACKGROUND OF THE INVENTION

Field of the Invention

The technical field relates to an apparatus and a method for producing a Group III nitride semiconductor device and to a method for producing a semiconductor wafer. More particularly, the technical field relates to such an apparatus and a method employing plasma and to a semiconductor wafer production method employing plasma.

Background Art

In Group III nitride semiconductors such as GaN, band gaps can be controlled within the range of 0.6 eV to 6 eV by modulating the composition thereof. Thus, Group III nitride semiconductors are applicable to a wide wavelength range from near IR to deep UV and are widely used in light-emitting devices, laser diodes, photo detectors, and similar devices.

Also, Group III nitride semiconductors have a large breakdown electric field and a high melting point. Thus, Group III nitride semiconductors are expected to replace GaAs-based semiconductors; i.e., materials for a semiconductor device which provide high output power for high frequency and high temperature applications. In fact, HEMT devices and the like employing such a Group III nitride semiconductor have been developed.

Group III nitride semiconductors are epitaxially grown through, for example, metal organic chemical vapor deposition (MOCVD). In MOCVD, ammonia gas must be used in a large amount, and a MOCVD furnace must be equipped with an ammonia-detoxification equipment. Furthermore, the consumption of the large amount ammonia imposes high running cost. In MOCVD, a semiconductor layer is formed through a reaction between organometallic gas and ammonia, requiring a growth substrate to be at a high temperature. When the substrate has high temperature, difficulty is encountered in the growth of a high-quality InGaN layer having a high In concentration. In addition, since the thermal expansion coefficient of the growth substrate differs from that of the semiconductor layer, the grown semiconductor layer tends to be bent.

Another technique for the epitaxial growth of a Group III nitride semiconductor is molecular beam epitaxy (MBE). In MBE, a Group III nitride semiconductor can be grown at low growth temperatures. However, the growth rate decreases in the case of RF-MBE employing radical sources. In other words, RF-MBE is not appropriate for mass production. In the case of MBE employing ammonia gas, production cost rises due to the use of a large amount of ammonia gas.

Patent Document 1: Japanese Patent Application Laid-Open (kokai) No. 1999-36078

Meanwhile, there has been developed a plasma MOCVD apparatus employing plasma. Patent Document 1 discloses a plasma MOCVD apparatus, through which magnesium oxide film can be formed (see Patent Document 1, paragraphs [0020] to [0021]). However, high-quality crystalline Group III nitride semiconductor has not been yielded when plasma MOCVD is employed.

SUMMARY OF THE INVENTION

The present techniques have been conceived in order to solve the aforementioned conventional technical problems. Thus, an object of the present techniques are to provide an apparatus and a method for producing a Group III nitride semiconductor device which are appropriate for mass production of the semiconductor and which enable growth of a Group III nitride semiconductor at a temperature comparatively lower than a conventionally employed growth temperature. Another object is to provide a method for producing a semiconductor wafer.

In a first aspect of an apparatus, the apparatus for producing a Group III nitride semiconductor device, the apparatus comprising: a first electrode; a substrate support member for supporting a growth substrate; a first gas supply pipe for supplying a first gas to the substrate support member; a second gas supply pipe for supplying a second gas to the substrate support member. The first gas supply pipe comprises at least one first gas exhaust outlet and supplies an organometallic gas containing a Group III metal as the first gas, and the second gas supply pipe supplies a gas containing nitrogen gas as the second gas. The distance between the first electrode and the substrate support member is greater than the distance between the at least one first gas exhaust outlet of the first gas supply pipe and the substrate support member.

The apparatus for producing a Group III nitride semiconductor device carries out epitaxial growth of a Group III nitride semiconductor on the growth substrate. The second gas is converted into the plasma state, and the organometallic gas is supplied to the growth substrate. Since at least nitrogen gas is converted into the plasma state, the epitaxial growth of the Group III nitride semiconductor can be performed without elevating the substrate temperature. The thus grown Group III nitride semiconductors have sufficiently good crystallinity. Furthermore, the use of ammonia gas is avoided, and no ammonia gas detoxification equipment is needed.

In a second aspect of the apparatus for producing a Group III nitride semiconductor device, the second gas supply pipe supplies, as the second gas, a gas mixture containing nitrogen gas and hydrogen gas. Thus, nitrogen radicals, hydrogen radicals, hydrogen nitride compounds, and other species are formed.

In a third aspect of the apparatus for producing a Group III nitride semiconductor device, the first electrode is a plate-form electrode provided with a plurality of through-holes perforating the electrode from a first surface to a second surface thereof. The second gas supply pipe communicates with the plurality of through-holes of the first electrode. Thus, the second gas can be effectively converted into a plasma state.

In a fourth aspect of the apparatus for producing a Group III nitride semiconductor device, the first gas supply pipe has a ring-form ring member. The first gas exhaust outlet(s) is (are) disposed inwardly to the inside of the ring member.

In a fifth aspect of the apparatus for producing a Group III nitride semiconductor device, the distance between the first electrode and the first gas exhaust outlet is 30 mm or greater. Thus, the first gas exhaust outlet is not readily surrounded by the plasma generation zone.

In a sixth aspect of the apparatus for producing a Group III nitride semiconductor device, the distance between the first electrode and the substrate support member is 40 mm or greater. Thus, supply of electrons and other ions to the growth substrate can be prevented.

In a seventh aspect of the apparatus for producing a Group III nitride semiconductor device, the apparatus has a metal mesh member. The metal mesh member is disposed between the first gas supply pipe and the first electrode. Thus, supply of electrons and other ions to the growth substrate can be prevented.

In an eighth aspect of the apparatus for producing a Group III nitride semiconductor device, the apparatus has an RF power source that can impart an electric potential of a frequency of 30 MHz to 300 MHz to the first electrode.

In a ninth aspect of a method for producing a Group III nitride semiconductor device, the method comprising forming a semiconductor layer composed of a Group III nitride semiconductor on a main surface of a growth substrate. In formation of the semiconductor layer, a gas mixture containing nitrogen gas and hydrogen gas is converted into a plasma state. Then, the gas mixture in a plasma state is supplied to the growth substrate and, simultaneously, an organometallic gas containing a Group III metal in non-plasma state is supplied to the growth substrate.

In a tenth aspect of a method for producing a semiconductor wafer, the method comprising forming a semiconductor layer composed of a Group III nitride semiconductor on a main surface of a wafer. In formation of the semiconductor layer, a gas mixture containing nitrogen gas and hydrogen gas is converted into a plasma state. Then, the gas mixture in a plasma state is supplied to the wafer and, simultaneously, an organometallic gas containing a Group III metal in non-plasma state is supplied to the growth substrate.

The present techniques provide an apparatus and a method for producing a Group III nitride semiconductor device as well as a method for producing a semiconductor wafer, which are appropriate for mass production of the semiconductor and which enable the growth of a Group III nitride semiconductor at a temperature comparatively lower than a conventionally employed growth temperature.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

With reference to the drawings, there will next be described embodiments of the apparatus and the method for producing a Group III nitride semiconductor device as well as the method for producing a semiconductor wafer, which are suited for mass production of the semiconductor and which enable growth of a Group III nitride semiconductor at a temperature comparatively lower than a conventionally employed growth temperature.

Embodiment 1

1. Apparatus for Producing a Group III Nitride Semiconductor

Figure 1:
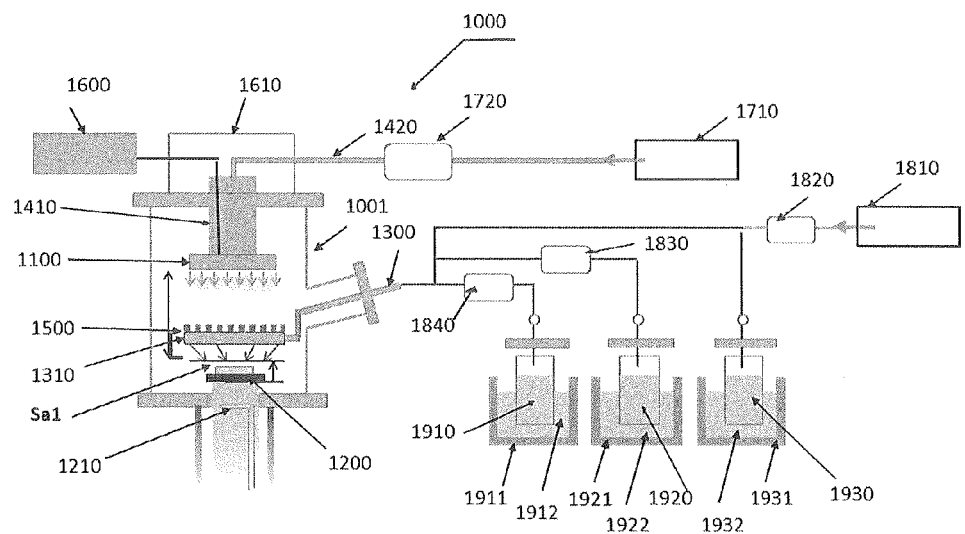
FIG. 1 is a schematic diagram of a production apparatus according to Embodiment 1.

FIG. 1 is a schematic diagram of a production apparatus 1000 for producing a Group III nitride semiconductor device of Embodiment 1. The production apparatus 1000 generates a plasma of a gas mixture containing nitrogen gas and hydrogen gas, and supplies, to a growth substrate, the generated plasma-related products as well as an organometallic gas containing a Group III metal in non-plasma state.

The production apparatus 1000 includes a furnace body 1001, a shower head electrode 1100, a susceptor 1200, a heater 1210, a first gas supply pipe 1300, a gas feed chamber 1410, a second gas supply pipe 1420, a metal mesh 1500, an RF power source 1600, a matching box 1610, a first gas supply section 1710, a second gas supply section 1810, gas containers 1910, 1920, and 1930, thermostat baths 1911, 1921, and 1931, and mass-flow controllers 1720, 1820, 1830, and 1840. The production apparatus 1000 also includes an exhaust outlet (not illustrated).

The shower head electrode 1100 serves as a first electrode to which periodically varying electric potential is applied. The shower head electrode 1100 is made of a material such as stainless steel. Needless to say, the electrode may be made of another metallic material. The shower head electrode 1100 is a plate-form electrode. The shower head electrode 1100 is provided with a plurality of through-holes perforating the electrode from a first surface to a second surface thereof (not illustrated). The plurality of through-holes communicate with the gas feed chamber 1410 and the second gas supply pipe 1420. Thus, the second gas supplied through from the gas feed chamber 1410 to the furnace body 1001 is suitably converted into a plasma state. The RF power source 1600 serves as a potential-imparting member that can impart a high-frequency electric potential to the shower head electrode 1100.

The susceptor 1200 serves as a substrate support member for sustaining a substrate Sa1. The susceptor 1200 is made of a material such as graphite. Needless to say, the susceptor may be made of another conductive material. The substrate Sa1 serves as a growth substrate for the growth of a Group III nitride semiconductor.

The first gas supply pipe 1300 supplies a first gas to the susceptor 1200. Specifically, the first gas is supplied to the substrate Sa1 supported by the susceptor 1200. The first gas is an organometallic gas containing a Group III metal and may further contain another carrier gas. The first gas supply pipe 1300 has a ring-form ring member 1310. The ring member 1310 of the first gas supply pipe 1300 is provided with 12 through-holes (not illustrated), which are disposed inwardly to the inside of the ring member 1310. These through-holes serve as first gas exhaust outlets. Thus, the first gas is jetted inwardly to the inside of the ring member 1310. As mentioned hereinbelow, the first gas supply pipe 1300 is disposed at a distal position with respect to the plasma generation zone.

The second gas supply pipe 1420 supplies a second gas to the susceptor 1200. Specifically, the second gas is supplied to the gas feed chamber 1410 and the furnace body 1001 and also to the substrate Sa1 supported by the susceptor 1200. The second gas supply pipe 1420 supplies the second gas to the furnace body 1001. The second gas which passes through the second gas supply pipe 1420 is a gas containing at least nitrogen gas. Preferably, the second gas supply pipe 1420 supplies, as the second gas, a gas mixture of nitrogen gas and hydrogen gas. The gas feed chamber 1410 temporarily retains the gas mixture of nitrogen gas and hydrogen gas and supplies the gas mixture to the through-holes of the shower head electrode 1100.

The metal mesh 1500 traps charged particles. The metal mesh 1500 is made of, for example, stainless steel. Needless to say, the metal mesh may be made of another metallic material. The metal mesh 1500 is disposed between the shower head electrode 1100 and the susceptor 1200. Thus, as mentioned hereinbelow, there can be suppressed transfer of charged particles generated in the plasma generation zone to the substrate Sa1 supported by the susceptor 1200. Also, the metal mesh 1500 is disposed between the shower head electrode and the ring member 1310 of the first gas supply pipe 1300. Thus, there can be prevented collision of the charged particles with molecules of the organometallic compound containing a Group III metal which are jetted through the first gas supply pipe 1300.

The furnace body 1001 accommodates at least the shower head electrode 1100, the susceptor 1200, the ring member 1310 of the first gas supply pipe 1300, and the metal mesh 1500. The furnace body 1001 is made of a material such as stainless steel. However, the furnace body 1001 may be made of another conductive material.

The furnace body 1001, metal mesh 1500, and first gas supply pipe 1300 are all made of a conductive material and grounded. Thus, when an electric potential is applied to the shower head electrode 1100, a voltage is applied to the pairs between the shower head electrode 1100 and the furnace body 1001, the metal mesh 1500, and the first gas supply pipe 1300. Furthermore, conceivably, electric discharge occurs at least one pair between the shower head electrode 1100 and the furnace body 1001, the metal mesh 1500, and the first gas supply pipe 1300. As a result, an electric field of high frequency and high field strength is provided directly under the shower head electrode 1100. Thus, the zone directly under the shower head electrode 1100 serves as a plasma generation zone.

The second gas, which is a gas mixture of nitrogen gas and hydrogen gas is converted into a plasma state in the plasma generation zone. In the plasma generation zone, several plasma-related products are generated. In this case, the plasma-related products include nitrogen radicals, hydrogen radicals, hydrogen nitride compounds, electrons, and other ions. The hydrogen nitride compounds include NH, $NH_2$, $NH_3$, excited state species thereof, and other species.

The shower head electrode 1100 is disposed a sufficient distance from the susceptor 1200. The distance between the shower head electrode 1100 and the susceptor 1200 is preferably 40 mm to 200 mm, more preferably 40 mm to 150 mm. When the distance between the shower head electrode 1100 and the susceptor 1200 is small, the susceptor 1200 might be surrounded by the plasma generation zone. When the distance between the shower head electrode 1100 and the susceptor 1200 is 40 mm or greater, overlap of the plasma generation zone with the susceptor 1200 is substantially prevented. Thus, charged particles cannot reach the substrate Sa1. When the distance between the shower head electrode 1100 and the susceptor 1200 is large, arrival of nitrogen radicals, hydrogen nitride compounds, etc. to the substrate Sa1 supported by the susceptor 1200 is impeded. The distance is adjusted in consideration of the scale of the plasma generation zone and other plasma-related conditions.

The distance between the shower head electrode 1100 and the susceptor 1200 is greater than the distance between the through-hole(s) in the ring member 1310 of the first gas supply pipe 1300 and the susceptor 1200. The distance between the through-hole(s) in the ring member 1310 of the first gas supply pipe 1300 and the shower head electrode 1100 is 30 mm to 190 mm, preferably 30 mm to 140 mm.

Under the distance ranges, migration of charged particles into the first gas can be prevented, and nitrogen radicals, hydrogen nitride compounds, etc. can readily reach the substrate Sa1. Thus, a semiconductor layer is deposited on the substrate Sa1 from the second gas in plasma state and the first gas in non-plasma state. These distances are adjusted in consideration of the scale of the plasma generation zone and other plasma-related conditions.

The heater 1210 is disposed to heat, by the mediation of the susceptor 1200, the substrate Sa1 supported by the susceptor 1200.

The mass-flow controllers 1720, 1820, 1830, and 1840 control respective gas flow rates. The thermostat baths 1911, 1921, and 1931 are filled with antifreezes 1912, 1922, and 1932, respectively. Each of the gas containers 1910, 1920, and 1930 accommodates an organometallic gas containing a Group III metal. The gas containers 1910, 1920, and 1930 contain trimethylgallium, trimethylindium, and trimethylaluminum, respectively. Needless to say, another organometallic gas containing a Group III metal, such as triethylgallium, may be employed.

2. Production Conditions Employed in the Production Apparatus

TABLE 1 shows production conditions employed in the production apparatus 1000. Notably, the conditions shown in TABLE 1 are merely examples, which should not be construed as limiting the technique thereto. The RF power is from 100 W to 1,000 W. The frequency of the electric potential applied to the shower head electrode 1100 by the RF power source 1600 is from 30 MHz to 300 MHz. The substrate temperature is from 400° C. to 900° C. The substrate temperature may be higher than the room temperature. The internal pressure of the production apparatus 1000 is from 1 Pa to 10,000 Pa.

TABLE 1

| | |
|---|---|
| RF power | 100 W to 1,000 W |
| Frequency | 30 MHz to 300 MHz |
| Substrate temperature | 400° C. to 900° C. |
| Internal pressure | 1 Pa to 10,000 Pa |

3. Method for Producing Semiconductor Wafer 3-1. Substrate Cleaning

Next will be described a method for producing a semiconductor wafer by means of the production apparatus 1000 of Embodiment 1. Firstly, the substrate Sa1 is prepared. An example of the substrate Sa1 is a c-plane sapphire substrate. Needless to say, a substrate of another material may also be used. The substrate Sa1 is placed in the production apparatus 1000, and the substrate is heated to about 400° C. while hydrogen gas is supplied to the production apparatus. Through this procedure, the surface of the substrate Sa1 is chemically reduced and cleaned. The substrate temperature may be further elevated.

3-2. Semiconductor Layer Formation Step

Then, the RF power source 1610 is put on. A gas mixture of nitrogen gas and hydrogen gas is supplied through the second gas supply pipe 1420. The gas mixture is supplied into the furnace body 1001 through the through-holes of the shower head electrode 1100 and is converted into a plasma state directly under the shower head electrode 1100. Thus, a plasma generation zone is created directly under the shower head electrode 1100. In the plasma generation, nitrogen radicals and hydrogen radicals are formed. The thus-formed nitrogen radicals and hydrogen radicals are reacted, to thereby conceivably form hydrogen nitride compounds. In addition, electrons and other charged particles are simultaneously generated.

Subsequently, the radical gas mixture containing nitrogen radicals, hydrogen radicals, hydrogen nitride compounds, electrons, and other charged particles is fed toward the substrate Sa1. The radical gas mixture is formed directly under the shower head electrode 1100. Since the distance between the shower head electrode 1100 and the substrate Sa1 is sufficiently large, electrons and charged particles such as ions contained in the radical gas mixture do not readily reach the substrate Sa1. Also, charged particles are readily captured by the metal mesh 1500. Thus, conceivably, nitrogen radicals, hydrogen radicals, and hydrogen nitride compounds are exclusively supplied toward the substrate Sa1. The nitrogen radicals and hydrogen nitride compounds exhibit higher reactivity, as compared with generally employed ammonia. Therefore, the epitaxial growth of a semiconductor layer can be accomplished at a temperature lower than the temperature conventionally employed for MOCVD.

Meanwhile, a Group III organometallic gas is supplied through the ring member 1310 of the first gas supply pipe 1300. Examples of the Group III organometallic compound include trimethylgallium, trimethylindium, and trimethylaluminum. These gases are involved in the radical gas mixture reaching toward the substrate Sa1 and are simultaneously fed to the substrate Sa1. The Group III organometallic gas is fed to the substrate Sa1 in the non-plasma state.

In the semiconductor wafer production method according to Embodiment 1, a gas mixture containing nitrogen gas and hydrogen gas is converted into the plasma state, and the plasma-related product is supplied to the growth substrate, while an organometallic gas containing a Group III metal in the non-plasma state is supplied to the growth substrate.

3-3. Semiconductor Wafer

Through the aforementioned epitaxial growth procedure, a Group III nitride semiconductor is formed on a main surface of the substrate Sa1, to thereby produce a semiconductor wafer. The Group III nitride semiconductor forming the semiconductor wafer has high crystallinity.

4. Difference from Production by Means of a Conventional MOCVD Furnace

According to the present technique, a Group III nitride semiconductor can be grown without employing a high substrate temperature. Thus, the present technique is advantageous for forming an InGaN layer having high In content or the like, whose crystal growth is difficult at high substrate temperatures. The present technique does not require a large mass flow of ammonia, which is also advantageous. Thus, no ammonia gas detoxification apparatus is needed. This reduces production apparatus cost and running cost.

5. Modifications 5-1. Through-Holes of Ring Member

In Embodiment 1, the first gas supply pipe 1300 is provided with at least one through-hole in the ring member 1310. However, alternatively, the through-holes may be disposed inwardly and downwardly to the inside of the ring. The angle formed between a plane including the ring member 1310 and the opening of the through-hole is, for example, 45°. The angle may be tuned within the range of 0° to 60°. Needless to say, the angle is adjusted in consideration of the diameter of the ring member 1310 and the distance between the ring member 1310 and the susceptor 1200. One or more though-holes may be provided. In a preferred mode, a plurality of through-holes are arranged at constant intervals in the ring member 1310.

6. Summary of Embodiment 1

The production apparatus 1000 of Embodiment 1 enables epitaxial growth of a Group III nitride semiconductor on a growth substrate. A gas mixture of nitrogen gas and hydrogen gas is converted into the plasma state, and an organometallic gas containing a Group III metal remains in the non-plasma state. These gases are supplied to the growth substrate. Since conversion into plasma is performed simultaneously with mixing nitrogen gas and hydrogen gas, epitaxial growth of the Group III nitride semiconductor can be performed without employing a high substrate temperature. The thus-formed Group III nitride semiconductor has sufficient crystallinity. Furthermore, the use of ammonia gas is avoided, and no ammonia gas detoxification apparatus is needed in the production apparatus of Embodiment 1.

Embodiment 2

Embodiment 2 will next be described. The semiconductor device of Embodiment 2 is a semiconductor light-emitting device having Group III nitride semiconductor layers.

1. Semiconductor Light-Emitting Device

Figure 2:
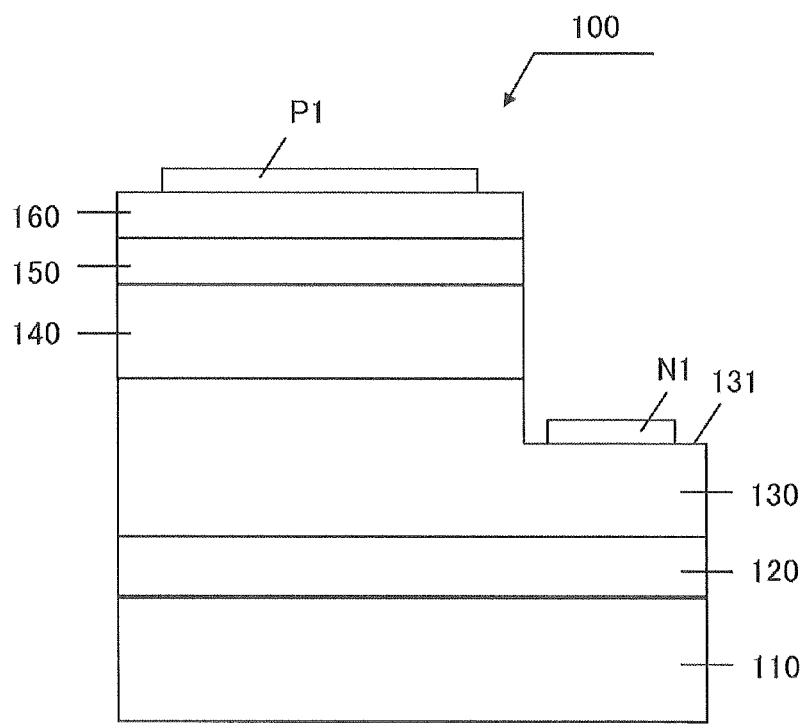
FIG. 2 is a schematic view of the structure of a light-emitting device according to Embodiment 2.

FIG. 2 shows a light-emitting device 100 of Embodiment 2. The light-emitting device 100 has Group III nitride semiconductor layers. The light-emitting device 100 has a substrate 110, a buffer layer 120, an n-GaN layer 130, a light-emitting layer 140, a p-AlGaN layer 150, a p-GaN layer 160, a p-electrode P1, and an n-electrode N1. The light-emitting layer 140 has a well layer and a barrier layer. The well layer includes, for example, an InGaN layer. The barrier layer includes, for example, an AlGaN layer. The deposited structure shown in FIG. 2 is merely an example, and other deposited structures may be employed in the technique.

2. Semiconductor Light-Emitting Device Production Method 2-1. Semiconductor Layer Formation Step By means of the same production apparatus 1000 as employed in Embodiment 1, a Group III nitride semiconductor layer is formed on the substrate 110. The production method is carried out under almost the same semiconductor wafer production conditions as employed in Embodiment 1. On the substrate 110, there are formed a buffer layer 120, an n-GaN layer 130, a light-emitting layer 140, a p-AlGaN layer 150, and a p-GaN layer 160. These semiconductor layers may be formed by appropriately choosing raw material gases.

2-2. Groove Formation Step

The deposited body is recessed through etching, for example, ICP, to thereby form a groove extending from the p-GaN layer 160 to the intermediate level of the n-GaN layer 130. Through provision of the groove, an exposed portion 131 of the n-GaN layer 130 is obtained.

2-3. Electrode Formation Step

Then, the n-electrode N1 is formed on the exposed portion 131 of the n-GaN layer 130, and the p-electrode P1 is formed on the p-GaN layer 160.

2-4. Other Steps

Other steps such as an annealing step and an insulating film formation step may optionally be carried out.

Embodiment 3

Embodiment 3 will next be described. The semiconductor device of Embodiment 3 is an MIS-type semiconductor device having Group III nitride semiconductor layers.

1. MIS-Type Semiconductor Device

Figure 3:
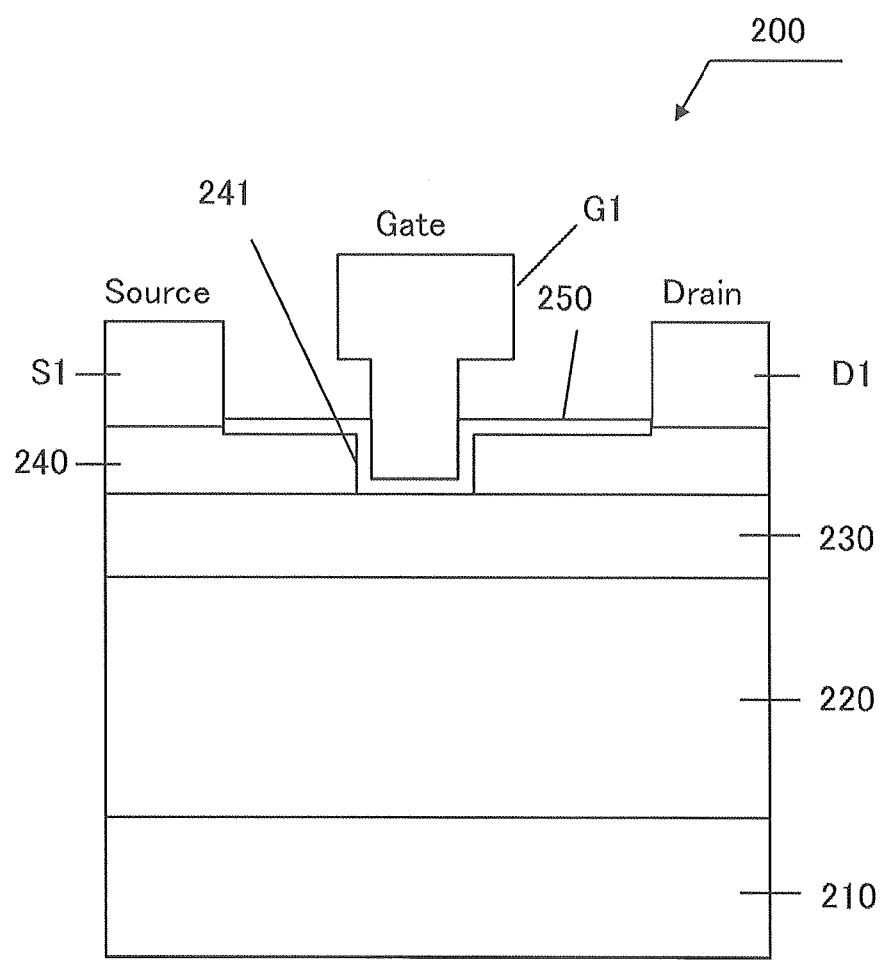
FIG. 3 is a schematic view of the structure of an MIS semiconductor device according to Embodiment 3.

As shown in FIG. 3, the MIS-type semiconductor device 200 has a substrate 210, a buffer layer 220, a GaN layer 230, an AlGaN layer 240, an insulating film 250, a source electrode S1, a gate electrode S1, and a drain electrode D1. The source electrode S1 and the drain electrode D1 are formed on the AlGaN layer 240. The gate electrode G1 is isolated from a recess 241 of the AlGaN layer 240 by inserting the insulating film 250 intervening therebetween.

2. MIS-Type Semiconductor Device Production Method 2-1. Semiconductor Layer Formation Step By means of the same production apparatus 1000 as employed in Embodiment 1, a Group III nitride semiconductor layer is formed on the substrate 210. The production method is carried out under almost the same semiconductor wafer production conditions as employed in Embodiment 1. A buffer layer 220, an GaN layer 230, and an AlGaN layer 240 are formed on the substrate 210. These semiconductor layers may be formed by appropriately choosing raw material gases.

2-2. Groove Formation Step

The deposited body is recessed through etching, for example, ICP, to thereby form a recess 241 in the AlGaN layer 240.

2-3. Insulating Film Formation Step

Then, the insulating film 250 is formed on the recess 241.

2-4. Electrode Formation Step

Subsequently, the source electrode S1 and the drain electrode D1 are formed on the AlGaN layer 240. The gate electrode G1 is formed in the recess 241 by inserting the insulating film 250. Alternatively, the source electrode S1 and the drain electrode D1 may be formed before the formation of the insulating film 250. Thus, the MIS-type semiconductor device 200 can be produced.

EXAMPLES

A. Example

In this experiment, the production apparatus 1000 shown in FIG. 1 was employed. RF power was adjusted to 400 W. Nitrogen gas (750 sccm) and hydrogen gas (250 sccm) were mixed, and the mixed flow was supplied as a plasma gas to the production apparatus. A Group III organometallic gas was supplied thereto with 0.025 sccm to 2.0 sccm. The internal pressure of the production apparatus 1000 was adjusted to 100 Pa.

A c-plane sapphire substrate (diameter: 50 mm, thickness: 600 μm) was used as a growth substrate. The sapphire substrate was heated to 400° C. and maintained at 400° C. for 10 minutes. Subsequently, an GaN buffer layer was formed. Next, the substrate was heated to 800° C., and a GaN layer was formed on the buffer layer. The GaN layer had a thickness of 2.0 μm. The film growth rate was adjusted to about 2 μm/hr.

The thus-formed GaN layer was analyzed by X-ray diffraction. As a result, epitaxial growth of the GaN layer on the sapphire substrate was confirmed. The diffraction angle was considerably approximate to 34.5°, which is the theoretical value. By photoluminescence measurement, an intense band-end luminescence was observed.

B. Comparative Example

In this experiment, a conventional MOCVD furnace was employed. Hydrogen gas was flowed with a flow rate of 3.5 m/sec as a carrier gas for a Group III organometallic gas. The internal pressure of the MOCVD furnace was adjusted to 25 Torr.

A c-plane sapphire substrate (diameter: 50 mm, thickness: 600 μm) was used as a growth substrate. The sapphire substrate was heated to 1,210° C. and maintained at 1,210° C. for 10 minutes. Subsequently, a buffer layer was formed at a low temperature. Next, the substrate was cooled to 1,000° C., and a GaN layer was formed on the buffer layer. The GaN layer had a thickness of 3.0 μm. The film growth rate was adjusted to about 2 μm/hr.

The thus-formed GaN layer was analyzed by X-ray diffraction. As a result, epitaxial growth of the GaN layer on the sapphire substrate was confirmed. The diffraction angle was considerably approximate to 34.5°, which is the theoretical value. By photoluminescence measurement, an intense band-end luminescence was detected. The intensity was almost the same as that measured in the Example.

C. Summary of the Experiments

As described above, in the Example, a desired GaN crystal layer having a satisfactorily uniform thickness was able to be formed at a reasonable film growth rate. The crystalline GaN was found to have high crystallinity. The substrate temperature employed in the Example was lower than that employed in the Comparative Example. Thus, the production apparatus 1000 is appropriate for mass-production of a Group III nitride semiconductor device. In addition, no ammonia gas is required.

Notably, a small amount of ammonia gas was detected in the exhaust outlet of the production apparatus 1000, after during the growth of the GaN layer. In the Example, no ammonia gas was supplied into the production apparatus 1000. Therefore, ammonia gas is conceivably formed through reaction between nitrogen radicals and hydrogen radicals, which are generated in the plasma generation zone.

What is claimed is:

1. An apparatus for producing a Group III nitride semiconductor device, the apparatus comprising:
   a furnace body;
   a first electrode to which a periodically varying electric potential is applied;
   a substrate support member for supporting a substrate;
   a first gas supply pipe for supplying a first gas to the substrate support member; and
   a second gas supply pipe for supplying a second gas to the substrate support member,
   wherein the first electrode and the substrate support member are in the furnace body,
   wherein the first gas supply pipe comprises at least one first gas exhaust outlet and supplies an organometallic gas containing a Group III metal as the first gas to the substrate support member, without passing through a plasma generation region;
   the second gas supply pipe supplies a gas containing nitrogen gas as the second gas; and
   a distance between the first electrode and the substrate support member is greater than a distance between the at least one first gas exhaust outlet of the first gas supply pipe and the substrate support member.

2. The apparatus for producing a Group III nitride semiconductor device according to claim 1, wherein the first gas supply pipe supplies the organometallic gas containing Al, Ga, or In, and the substrate support member supports the substrate for growing the Group III nitride semiconductor.

3. The apparatus for producing a Group III nitride semiconductor device according to claim 1, wherein the first electrode is a plate-form electrode provided with a plurality of through-holes perforating the electrode from a first surface to a second surface thereof, and the second gas supply pipe communicates with the plurality of through-holes of the first electrode.

4. The apparatus for producing a Group III nitride semiconductor device according to claim 1, further comprising:
a ring member which is directly connected to the first gas supply pipe.

5. The apparatus for producing a Group III nitride semiconductor device according to claim 4, wherein the first gas exhaust outlet is disposed inwardly to the inside of the ring member.

6. The apparatus for producing a Group III nitride semiconductor device according to claim 1, wherein the first electrode is not a waveguide slot antenna.

7. The apparatus for producing a Group III nitride semiconductor device according to claim 1, wherein the apparatus is to deposit a Group III nitride semiconductor.

8. The apparatus for producing a Group III nitride semiconductor device according to claim 1, wherein the plasma gas region comprises a material gas of a Group III nitride semiconductor.

9. The apparatus for producing a Group III nitride semiconductor device according to claim 1, wherein a distance between the first electrode and the first gas exhaust outlet is 30 mm or greater.

10. The apparatus for producing a Group III nitride semiconductor device according to claim 2, wherein a distance between the first electrode and the first gas exhaust outlet is 30 mm or greater.

11. The apparatus for producing a Group III nitride semiconductor device according to claim 1, wherein a distance between the first electrode and the substrate support member is 40 mm or greater.

12. The apparatus for producing a Group III nitride semiconductor device according to claim 2, wherein a distance between the first electrode and the substrate support member is 40 mm or greater.

13. The apparatus for producing a Group III nitride semiconductor device according to claim 1, wherein the apparatus comprises a metal mesh member, and the metal mesh member is disposed between the first gas supply pipe and the first electrode.

14. The apparatus for producing a Group III nitride semiconductor device according to claim 4, wherein the apparatus comprises a metal mesh member, and the metal mesh member is disposed between the ring member and the first electrode.

15. The apparatus for producing a Group III nitride semiconductor device according to claim 1, wherein the apparatus comprises an RF power source that can impart an electric potential of a frequency of 30 MHz to 300 MHz to the first electrode.

16. The apparatus for producing a Group III nitride semiconductor device according to claim 2, wherein the apparatus comprises an RF power source that can impart an electric potential of a frequency of 30 MHz to 300 MHz to the first electrode.

17. The apparatus for producing a Group III nitride semiconductor device according to claim 1, wherein the second gas supply pipe supplies, as the second gas, a gas mixture containing nitrogen gas and hydrogen gas.

18. The apparatus for producing a Group III nitride semiconductor device according to claim 4, wherein the apparatus comprises a plasma generation region between the first electrode and the ring member, and a non-plasma region between the ring member and the substrate support member,
the ring member supplying the organometallic gas to the substrate support member passing through the non-plasma region, without passing through the plasma generation region, and
the second gas supply pipe supplying the second gas to the substrate support member passing through the plasma generation region and the non-plasma region.

19. An apparatus for producing a Group III nitride semiconductor device, the apparatus comprising:
a furnace body;
a first electrode located in the furnace body, and to which periodically varying electric potential is applied for generating a plasma generation region in the furnace body;
a substrate support member located in the furnace body, for supporting a substrate;
a first gas supply pipe for supplying a first gas to the substrate support member; and
a second gas supply pipe for supplying a second gas to the substrate support member,
wherein the first gas supply pipe comprises at least one first gas exhaust outlet and supplies an organometallic gas containing a Group III metal as the first gas to the substrate support member, without passing through the plasma generation region;
the second gas supply pipe supplies a gas containing nitrogen gas as the second gas; and
a distance between the first electrode and the substrate support member is greater than a distance between the at least one first gas exhaust outlet of the first gas supply pipe and the substrate support member.

20. An apparatus for producing a Group III nitride semiconductor device, the apparatus comprising:
a furnace body;
a first electrode located in the furnace body, and to which periodically varying electric potential is applied for generating a plasma generation region in the furnace body;
a substrate support member located in the furnace body, for supporting a substrate;
a first gas supply pipe for supplying a first gas to the substrate support member; and
a second gas supply pipe for supplying a second gas to the substrate support member,
wherein the first gas supply pipe comprises at least one first gas exhaust outlet and supplies an organometallic gas containing a Group III metal as the first gas to a region inside the furnace body which is between the first electrode and the substrate support member and outside the plasma generation region;
the second gas supply pipe supplies a gas containing nitrogen gas as the second gas; and
a distance between the first electrode and the substrate support member is greater than a distance between the at least one first gas exhaust outlet of the first gas supply pipe and the substrate support member.

* * * * *